(12) United States Patent
Lin

(10) Patent No.: US 8,385,071 B2
(45) Date of Patent: *Feb. 26, 2013

(54) HEAT RADIATOR

(75) Inventor: Sheng-Huang Lin, Sinjhuang (TW)

(73) Assignee: Asia Vital Components Co., Ltd., Sinjhuang, Taipei County (TW)

( * ) Notice: Subject to any disclaimer, the term of this patent is extended or adjusted under 35 U.S.C. 154(b) by 89 days.

This patent is subject to a terminal disclaimer.

(21) Appl. No.: 12/288,520

(22) Filed: Oct. 21, 2008

(65) Prior Publication Data

US 2009/0262505 A1 Oct. 22, 2009

(30) Foreign Application Priority Data

Apr. 16, 2008 (TW) .................. 97206477 U

(51) Int. Cl.
*H05K 7/20* (2006.01)
*F28F 7/00* (2006.01)

(52) U.S. Cl. ........ 361/710; 361/704; 361/709; 361/717; 361/711; 165/80.3; 165/185

(58) Field of Classification Search .................. 361/704, 361/709, 710, 711, 717; 165/80.3, 185
See application file for complete search history.

(56) References Cited

U.S. PATENT DOCUMENTS

| | | | |
|---|---|---|---|
| 4,520,541 A * | 6/1985 | Miki et al. .................. 29/889.23 |
| 5,309,983 A | 5/1994 | Bailey .......................... 165/80.3 |
| 5,597,034 A * | 1/1997 | Barker et al. ................. 165/80.3 |
| 5,661,638 A * | 8/1997 | Mira .............................. 361/697 |
| 6,397,941 B1 * | 6/2002 | McCullough ................. 165/185 |
| 6,407,919 B1 * | 6/2002 | Chou ............................. 361/697 |
| 6,466,444 B2 * | 10/2002 | Cheung ......................... 361/703 |
| 6,662,412 B2 * | 12/2003 | Chuang et al. .................. 24/457 |
| 6,671,172 B2 * | 12/2003 | Carter et al. .................. 361/697 |
| 6,778,390 B2 * | 8/2004 | Michael ........................ 361/695 |
| 6,913,072 B2 * | 7/2005 | Luo ........................... 165/104.21 |
| D509,483 S * | 9/2005 | Watanabe et al. ............ D13/179 |
| 7,142,422 B2 * | 11/2006 | Lee et al. ....................... 361/695 |
| D537,418 S * | 2/2007 | Watanabe et al. ............ D13/179 |
| 7,200,934 B2 * | 4/2007 | Carter et al. .............. 29/890.03 |
| 7,289,330 B2 * | 10/2007 | Lu et al. ........................ 361/710 |
| 7,331,756 B2 * | 2/2008 | Watanabe et al. ............. 415/191 |
| 7,423,877 B2 * | 9/2008 | Zhou et al. .................... 361/700 |
| 7,471,518 B2 * | 12/2008 | Gallina et al. ................. 361/719 |
| 7,493,940 B2 * | 2/2009 | Chen et al. ..................... 165/121 |
| 7,495,921 B2 * | 2/2009 | Chang et al. .................. 361/719 |
| 7,520,313 B2 * | 4/2009 | Lai et al. ....................... 165/80.3 |
| 7,532,472 B2 * | 5/2009 | Lin et al. ....................... 361/697 |
| 7,623,348 B2 * | 11/2009 | Otsuki et al. .................. 361/697 |
| 7,646,607 B2 * | 1/2010 | Gallina et al. ................. 361/710 |
| 2002/0017378 A1 * | 2/2002 | Hu ............................... 165/80.3 |
| 2002/0018336 A1 * | 2/2002 | Liang et al. ................... 361/697 |
| 2002/0046826 A1 * | 4/2002 | Kao ........................... 165/104.33 |

(Continued)

*Primary Examiner* — Bradley Thomas

(57) ABSTRACT

A heat radiator is in the form of a rectangular body having two opposite longer sides and two opposite shorter sides, and includes a contact section located at an end surface of the heat radiator for contacting with a heat source and having at least one extension wall outward extended therefrom to divide the heat radiator into a first heat-dissipating zone, which consists of a plurality of curved radiation fins outward extended from the contact section toward the two longer sides, and a second heat-dissipating zone, which consists of a plurality of straight or curved radiation fins outward extended from the contact section and the extension wall toward the two shorted sides. These radially outward extended radiation fins not only provide increased heat radiating areas, but also guide airflow produced by a cooling fan to smoothly flow therethrough to carry heat away from the heat radiator in different directions.

4 Claims, 5 Drawing Sheets

U.S. PATENT DOCUMENTS

| | | | |
|---|---|---|---|
| 2003/0048612 A1* | 3/2003 | Carter et al. | 361/718 |
| 2003/0063439 A1* | 4/2003 | Wei et al. | 361/703 |
| 2003/0131970 A1* | 7/2003 | Carter et al. | 165/80.3 |
| 2004/0045163 A1* | 3/2004 | Carter et al. | 29/890.03 |
| 2004/0080914 A1* | 4/2004 | Carter et al. | 361/718 |
| 2005/0036289 A1* | 2/2005 | Lee et al. | 361/699 |
| 2005/0061480 A1* | 3/2005 | Carter et al. | 165/80.3 |
| 2005/0150637 A1* | 7/2005 | Tan et al. | 165/104.33 |
| 2005/0280992 A1* | 12/2005 | Carter et al. | 361/697 |
| 2007/0121293 A1* | 5/2007 | Hong et al. | 361/697 |
| 2007/0146995 A1* | 6/2007 | Zhao et al. | 361/697 |
| 2007/0181288 A1* | 8/2007 | Chen et al. | 165/80.3 |
| 2007/0193718 A1* | 8/2007 | Carter et al. | 165/80.3 |
| 2007/0242433 A1* | 10/2007 | Lin et al. | 361/697 |
| 2008/0121369 A1* | 5/2008 | Long et al. | 165/80.3 |
| 2008/0174967 A1* | 7/2008 | Chang et al. | 361/719 |
| 2008/0180912 A1* | 7/2008 | Yamaoka et al. | 361/697 |
| 2008/0310119 A1* | 12/2008 | Giacoma | 361/719 |
| 2009/0120613 A1* | 5/2009 | Chen et al. | 165/80.3 |

* cited by examiner

HEAT RADIATOR

FIELD OF THE INVENTION

The present invention relates to a heat radiator, and more particularly to a heat radiator having a plurality of radiation fins radially outward extended from a center of the heat radiator, so that heat-carrying airflow may be guided out of the heat radiator in different directions.

BACKGROUND OF THE INVENTION

With the highly developed semiconductor technology, the currently available integrated circuits (ICs) have a largely reduced volume than before. To enable the ICs to process more data, the number of elements and components included in the current ICs is often several times of that in the conventional ICs having the same volume. However, heat produced by the ICs during operation thereof increases with the growing number of electronic elements and components in the ICs. For example, the heat produced by a common central processing unit (CPU) at full working load is high enough for burning out the whole CPU. Therefore, it is important to develop effective heat radiating means for the ICs.

Generally, a heat radiator is made of a metal material with high heat conductivity. In addition to the mounting of a cooling fan to carry away the heat produced by heat-producing elements, the heat radiator in the form of a radiating fin assembly is frequently used to obtain an enhanced heat radiating effect. In some other cases, heat pipes are further provided on the heat radiator to more quickly transfer and dissipate heat, so that products with ICs are protected against burning out.

FIG. 1 is a perspective view showing a conventional rectangular heat radiator 1, which includes a plurality of radiation fins 11 arranged in parallel to two longer sides of the heat radiator 1 and equally spaced from one another. The heat radiator 1 has a base 12 for directly contacting with a heat source 1A to conduct heat produced by the heat source to a main body of the heat radiator 1, so that the heat is radiated from the radiation fins 11. When the heat produced by the heat source 1A is transferred from the heat source via the base 12 to the radiation fins 11 of the heat radiator 1, the heat is radiated only via the radiation fins 11, and airflow carrying the heat outward diffuses only via spaces 111 defined between the parallel radiation fins 11 to provide the heat dissipating effect. Since the radiation fins 11 themselves have insufficient heat-radiating areas, and the spaces 111 between the parallel radiation fins 11 are quite narrow and extended straightly toward two opposite sides of the heat radiator 1, the conventional heat radiator 1 provides only narrow and horizontally oriented spaces 111 for dissipating heat. As a result, the conventional heat radiator 1 has low ventilating efficiency which directly leads to poor heat-dissipating efficiency. Therefore, the heat produced by the heat source 1A can be hardly effectively dissipated, and tends to stagnate around the heat radiator 1. In a worse condition, the heat source 1A will become damaged due to overheating. In brief, the conventional heat radiator 1 has the following disadvantages:

1. The conventional heat radiator has only very small heat-radiating areas.
2. The conventional heat radiator has only two opposite airflow outlets which are insufficient for dissipating the heat. Therefore, the heat is likely to stagnate around the heat radiator or the heat source without being easily and efficiently dissipated.
3. The conventional heat radiator has poor heat-dissipating efficiency.

It is therefore tried by the inventor to develop an improved heat radiator to solve the above problems with the conventional heat radiator.

SUMMARY OF THE INVENTION

A primary object of the present invention is to provide a heat radiator having heat-dissipating zones consisting of a plurality of curved and/or straight radiation fins outward extended from a center of the heat radiator, so as to provide the heat radiator with increased heat-dissipating areas and a plurality of airflow outlets oriented toward different directions. Therefore, heat produced by a heat source may fully diffuse into surrounding environment to largely enhance the heat dissipating effect of the heat radiator.

To achieve the above and other objects, the heat radiator according to the present invention has a rectangular body having two opposite longer sides and two opposite shorter sides. The heat radiator is provided at a central portion of an upper or a lower end surface with a contact section. At least one extension wall is outward extended from an outer periphery of the contact section to divide the heat radiator into a first heat-dissipating zone and a second heat-dissipating zone. The first heat-dissipating zone includes a plurality of curved radiation fins outward extended from an outer periphery of the contact section toward the two longer sides of the heat radiator; and the second heat-dissipating zone includes a plurality of straight or curved radiation fins outward extended from the outer periphery of the contact section and the extension wall toward the two shorter sides of the heat radiator. With the curved and straight radiation fins provided thereon, the heat radiator of the present invention may have heat radiating areas much larger than that of other conventional heat radiators having similar dimensions. Moreover, with the curved and straight radiation fins arranged around and radially outward extended from the central portions of the heat radiator, a plurality of airflow outlets oriented toward different directions are produced to allow the heat generated by the heat source to quickly dissipate at high efficiency.

Accordingly, the heat radiator of the present invention has the following advantages: (1) having increased heat-radiating areas; (2) providing improved heat-dissipating efficiency; (3) enabling quick heat dissipation without forming stagnated heat around the heat radiator; (4) providing differently oriented airflow outlets; and (5) allowing heat-carrying airflow to smoothly flow through spaces between the radiation fins.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1:
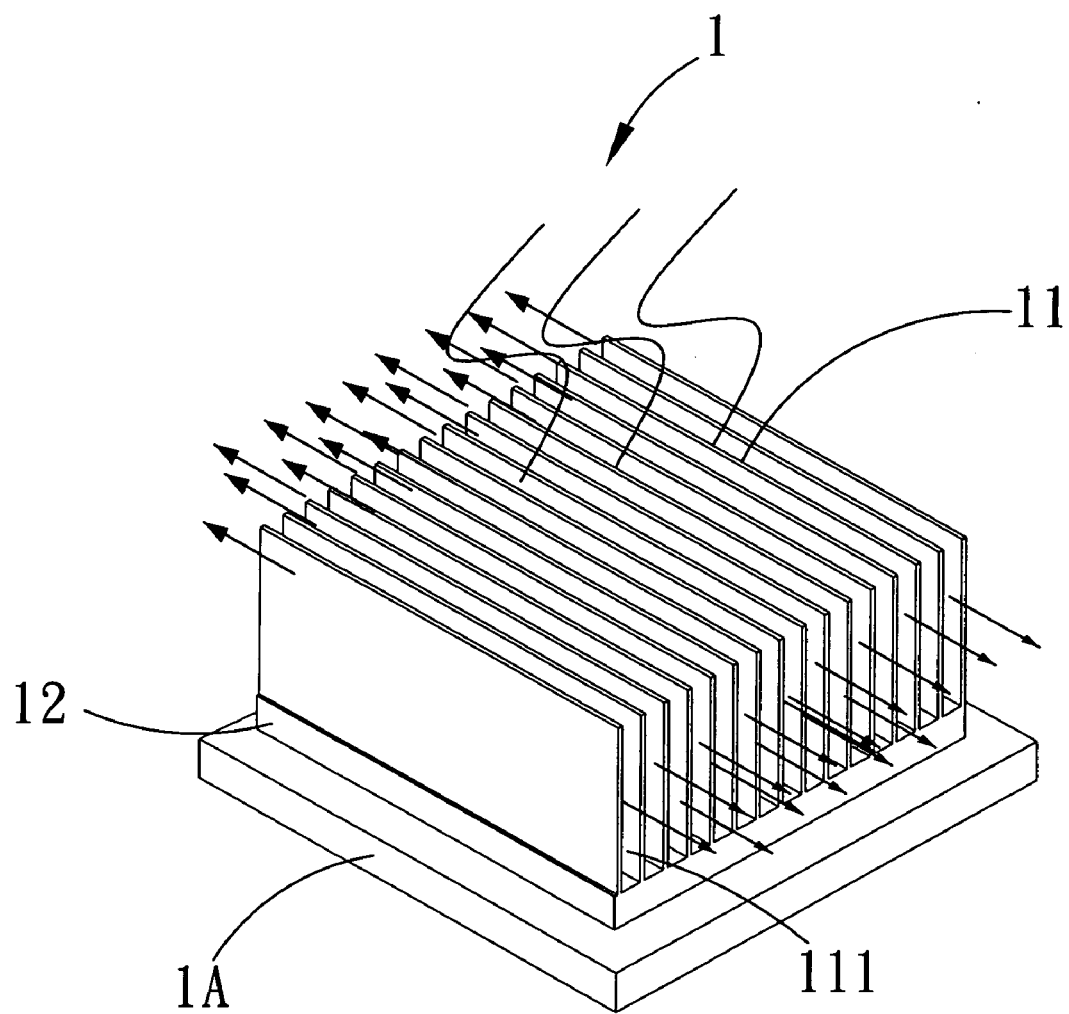
FIG. 1 is a perspective view of a conventional rectangular heat radiator.
Figure 2A:
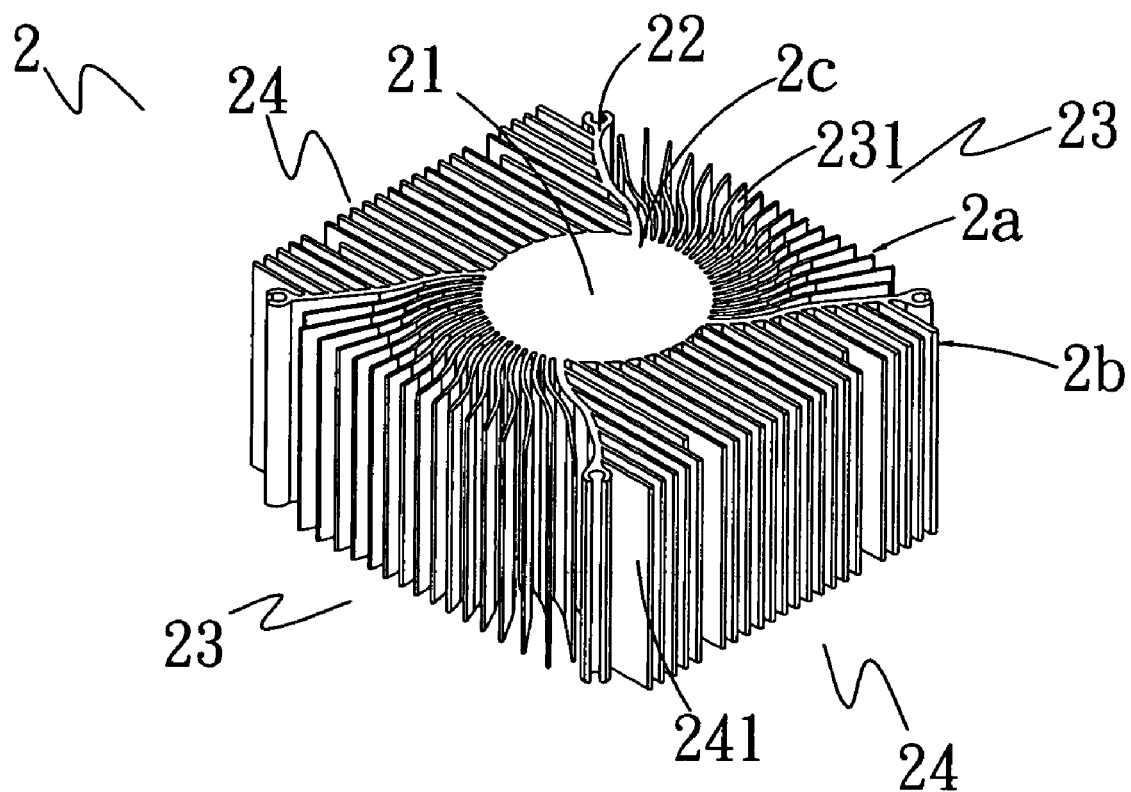
FIG. 2A is a top perspective view of a heat radiator according to a preferred embodiment of the present invention.
Figure 2B:
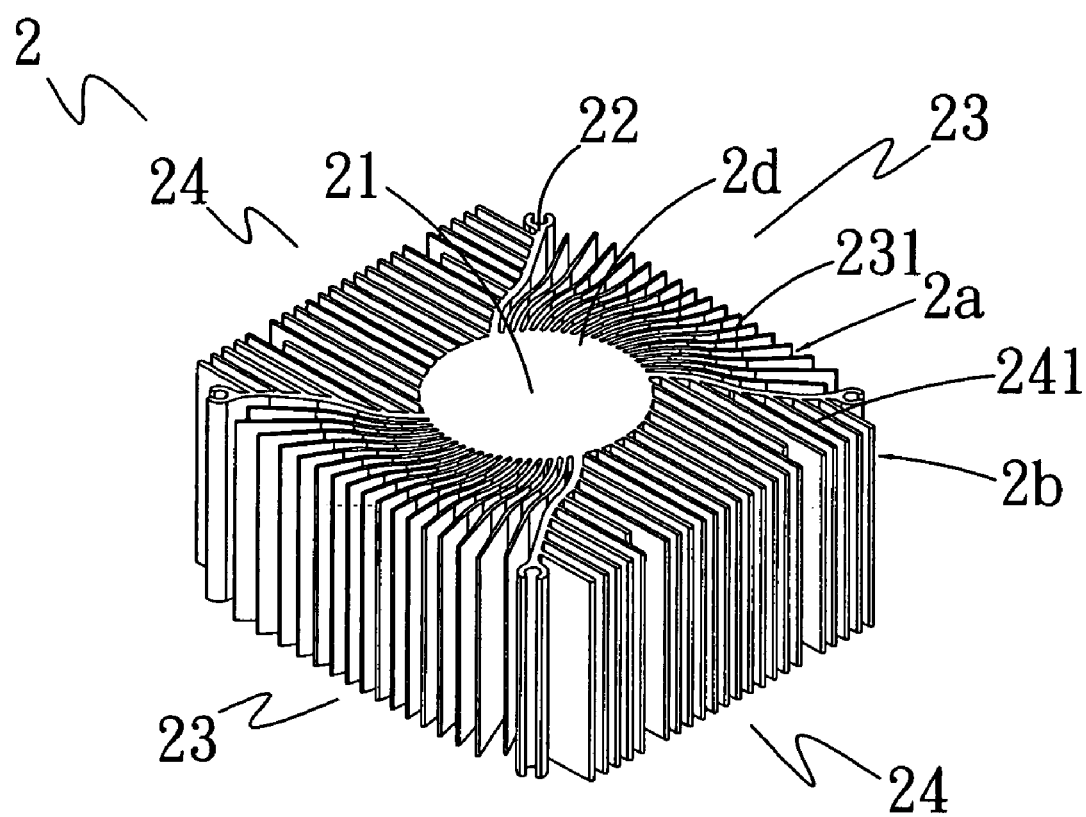
FIG. 2B is a bottom perspective view of the heat radiator of FIG. 2A.

Please refer to FIGS. 2A and 2B that are top and bottom perspective views, respectively, of a heat radiator 2 according to a preferred embodiment of the present invention. As can be clearly seen from FIGS. 2A and 2B, the heat radiator 2 has a rectangular body having two opposite longer sides 2a and two opposite shorter sides 2b, and an upper end surface 2c and a lower end surface 2d. A central portion of at least one of the upper end surface 2c and the lower end surface 2d is formed as a contact section 21 for contacting with a heat source (not shown). At least one extension wall 22 is outward extended from an outer periphery of the contact section 21 to divide the heat radiator 2 into a first heat-dissipating zone 23 and a second heat-dissipating zone 24. The first heat-dissipating zone 23 consists of a plurality of curved radiation fins 231 outward extended from the outer periphery of the contact section 21 toward the two longer sides 2a of the heat radiator 2; and the second heat-dissipating zone 24 consists of a plurality of straight radiation fins 241 outward extended from the outer periphery of the contact section 21 and one surface of the extension wall 22 toward the two shorter sides 2b of the heat radiator 2. With the provision of the first and second heat-dissipating zones 23, 24, the heat radiator 2 may have largely increased heat-radiating areas and a plurality of airflow outlets oriented toward different directions, and accordingly, largely enhanced heat dissipating performance. More specifically, with the curved and the straight radiation fins 231, 241 provided in the first and the second heat-dissipating zone 23, 24, respectively, the heat-radiating areas and the airflow outlets on the heat radiator 2 are largely increased to overcome the problems existed in the conventional heat radiators.

Figure 4:
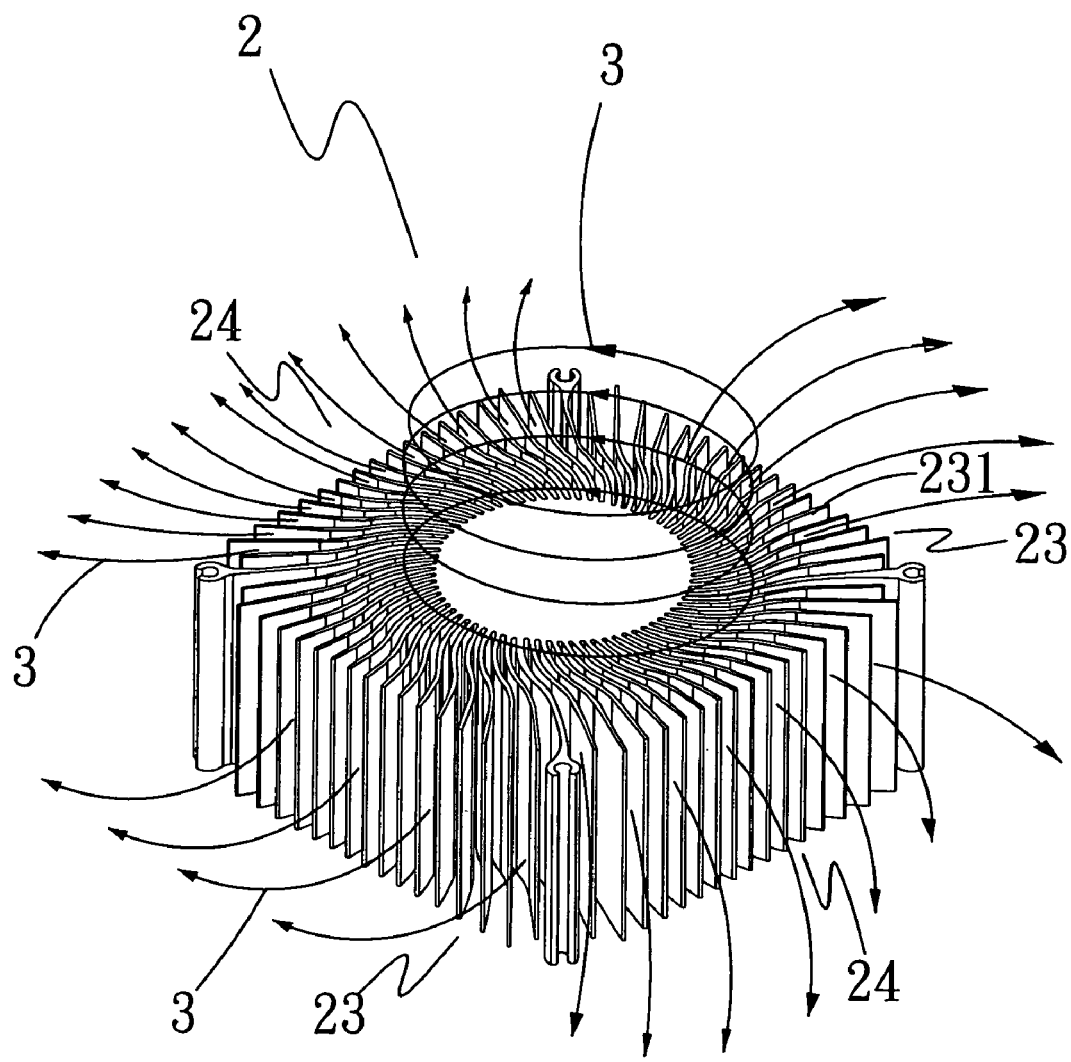
FIG. 4 shows the working manner of a heat radiator according to another embodiment of the present invention.

In another embodiment of the present invention, the second heat-dissipating zone 24 may also have curved radiation fins 241, as can be seen from FIG. 4.

Figure 3:
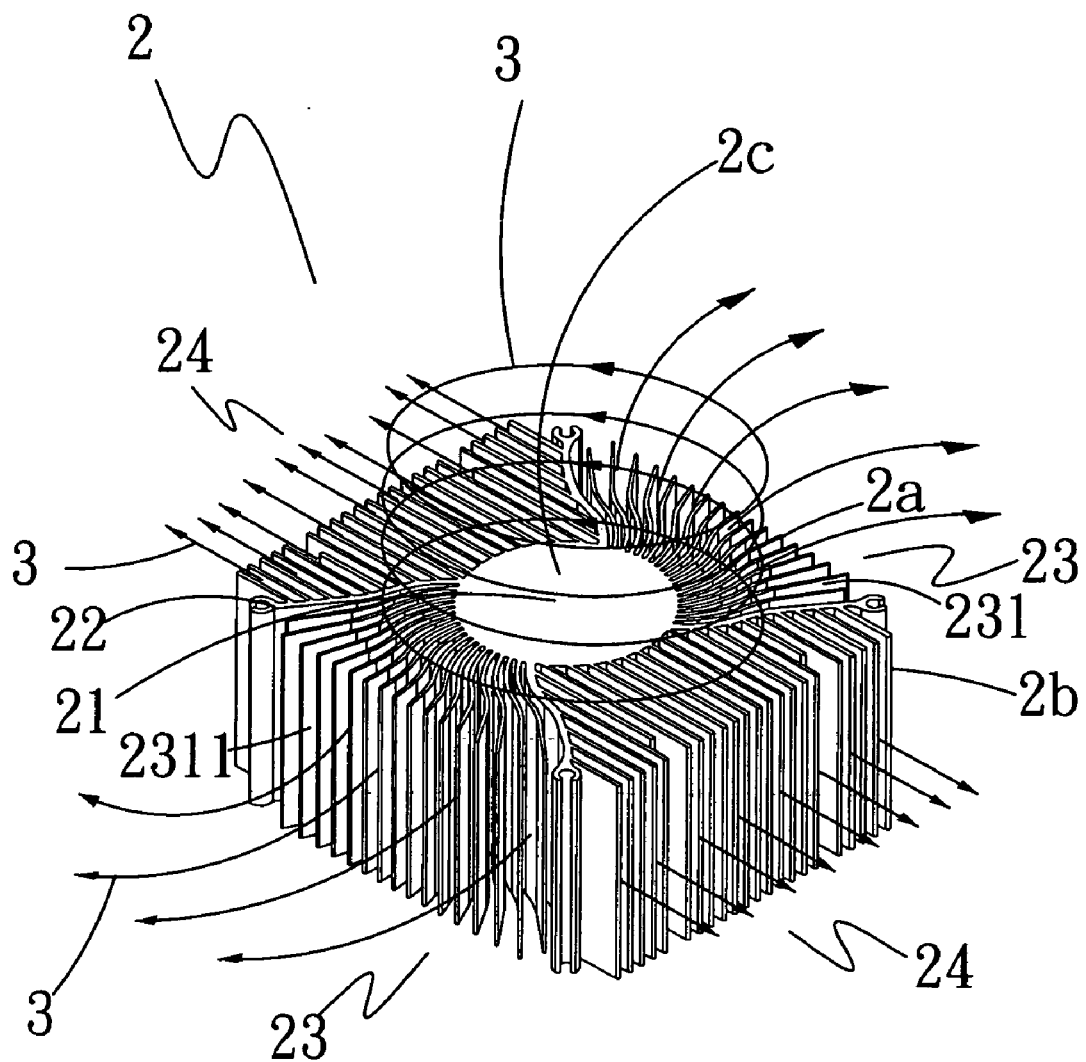
FIG. 3 shows the working manner of the heat radiator according to the preferred embodiment of the present invention.

Please refer to FIGS. 3 and 4. In the illustrated embodiments, the heat radiator 2 has four extension walls 22 and is divided into four equal parts. However, it is understood that the number of the extension walls 22 may be changed to alternatively divide the heat radiator 2 into two, six, or eight equal parts without being specifically limited.

The curved radiation fins 231 in the first heat-dissipating zone 23 are radially outward extended from the outer periphery of the contact section 21 toward the two longer sides 2a of the heat radiator 2, and the straight or curved radiation fins 241 in the second heat-dissipating zone 24 are radially outward extended from the outer periphery of the contact section 21 and the surfaces of the extension walls 22 adjoining to the second heat-dissipating zone 24 toward the two shorter sides 2b of the heat radiator 2. Since a distance between the outer periphery of the contact section 21 and each of the longer sides 2a of the heat radiator 2 is relatively short, the curved radiation fins 231 curvedly extended toward the longer sides 2a could each have an increased overall length to largely increase the heat-dissipating areas of the radiation fins 231. On the other hand, although a distance between each of the shorter sides 2b and the outer periphery of the contact section 21 and the surfaces of the extension walls 22 is relatively long to allow the straight radiation fins 241 to extend a considerably long distance, the radiating fins 241 may still be otherwise configured as curved radiation fins as shown in FIG. 4.

Please refer to FIGS. 3 and 4 that show the working manner of the heat radiator 2 of the present invention. When a cooling fan (not shown) creates airflow 3 to cool down the heat radiator 2, a part of the airflow 3 is blown to the first heat-dissipating zone 23 to carry away the heat absorbed by the heat radiator 2. The airflow 3 is guided by the curved radiation fins 231 in the first heat-dissipating zone 23 to flow from radially inner ends of the radiation fins 231 to heat-radiating surfaces 2311 of the radiation fins 231. Since the curved configuration of the radiation fins 231 is in conformity with a wind shear angle of the airflow 3 created by the cooling fan (not shown), the airflow 3 is able to contact with the entire heat-radiating surfaces 2311 of the radiation fins 231 to achieve the best possible cooling effect. Then, the airflow 3 flows out of the heat radiator 2 via radially outer ends of the radiation fins 231 and the heat is carried away by the airflow 3.

On the other hand, another part of the airflow 3 blown to the second heat-dissipating zone 24 is also guided by the straight or curved radiating fins 241 to quickly flow from radially inner ends to the radially outer ends of the radiation fins 241 to carry the heat away from the heat radiator 2.

The extension walls 22 may be curvedly or straightly outward extended from the contact section 21. In the illustrated embodiments of the present invention, there are four extension walls 22 dividing the heat radiator 2 into four equal parts, two of which are the first heat-dissipating zone 23 with the curved radiation fins 231 radially and curvedly outward extended toward the two longer sides 2a of the heat radiator 2, and the other two of which are the second heat-dissipating zone 24 with the straight or curved radiation fins 241 radially outward extended toward the two shorter sides 2b of the heat radiator 2. With the radially outward extended radiation fins 231, 241, the heat-carrying airflow 3 is quickly guided outward in four different directions. Therefore, with the above arrangements, the airflow 3 can be exactly controlled to diffuse outward, and heat absorbed by the heat radiator 2 may be completely carried by the airflow 3 away from the heat radiator 2 without stagnating therearound. As a result, an improved heat-dissipating effect is achieved.

The present invention has been described with some preferred embodiments thereof and it is understood that many changes and modifications in the described embodiments can be carried out without departing from the scope and the spirit of the invention that is intended to be limited only by the appended claims.

What is claimed is:

1. A heat radiator in the form of a rectangular body having two opposite longer sides and two opposite shorter sides, consisting of:
    a contact section being located at a central portion of an end surface of the heat radiator for contacting with a heat source, and having a plurality of radially spaced extension walls extended outward from an outer periphery of the contact section;
    a first heat-dissipating zone defined by said radially spaced extension walls consisting of a plurality of separate horizontally curved radiation fins radially distributed and extending outward only from the outer periphery of the contact section in a manner such that gaps between said curved fins increase outwardly from the outer periphery of the contact section toward the two longer sides of the heat radiator; the curved radiation fins having a first curved portion extending toward a second curved portion; the directions of the first curved portion being opposed to the directions of the second curved portion thereby forming an S-shape; wherein the S-shapes formed on the two longer sides increase the surface area and are oppositely configured such that the resulting outward air flow is directed in different directions; and a second heat-dissipating zone defined by said radially spaced extension walls and consisting of a plurality of radiation fins radially distributed and extended outward from the outer periphery of the contact section and a plurality of radiation fins extended outward from one surface of the radially spaced extension walls which together define the second heat-dissipating zone as directed toward the two shorter sides of the heat radiator whereby heat generated by the heat source is transferred via the central contact section to both the first and second heat-dissipating zones and dissipates into surrounding air from the radiation fins.

2. The heat radiator as claimed in claim 1, wherein the radiation fins for the second heat-dissipating zone are selected from the group consisting of curved radiation fins and straight radiation fins outward extended from the contact section and the extension wall toward the two shorter sides of the heat radiator.

3. The heat radiator as claimed in claim 1, wherein the contact section is located at one of a lower and an upper end surface of the heat radiator.

4. The heat radiator as claimed in claim 1, wherein the plurality of extension walls are curvedly or straightly outward extended from the outer periphery of the contact section.

* * * * *